United States Patent
Cho et al.

(10) Patent No.: US 9,564,389 B2
(45) Date of Patent: Feb. 7, 2017

(54) SEMICONDUCTOR PACKAGE WITH INTEGRATED DIE PADDLES FOR POWER STAGE

(71) Applicant: Infineon Technologies Americas Corp., El Segundo, CA (US)

(72) Inventors: Eung San Cho, Torrance, CA (US); Aida Abaca, San Juan (PH); Jobel A. Guanzon, Talisay (PH)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/631,745

(22) Filed: Feb. 25, 2015

(65) Prior Publication Data

US 2015/0270202 A1   Sep. 24, 2015

Related U.S. Application Data

(60) Provisional application No. 61/954,721, filed on Mar. 18, 2014.

(51) Int. Cl.
*H01L 23/495* (2006.01)
*H01L 23/31* (2006.01)

(52) U.S. Cl.
CPC ... *H01L 23/49575* (2013.01); *H01L 23/49537* (2013.01); *H01L 23/49551* (2013.01); *H01L 23/49562* (2013.01); *H01L 23/3107* (2013.01); *H01L 2224/73253* (2013.01)

(58) Field of Classification Search
CPC .......................... H01L 23/495; H01L 23/49568
See application file for complete search history.

(56) References Cited

U.S. PATENT DOCUMENTS

2005/0167849 A1* 8/2005 Sato .................... H01L 23/4334
257/778
2014/0353808 A1* 12/2014 Hosseini ........... H01L 23/49575
257/676

* cited by examiner

*Primary Examiner* — Marc Armand
(74) *Attorney, Agent, or Firm* — Shumaker & Sieffert, P.A.

(57) ABSTRACT

In one implementation, a semiconductor package includes a first conductive carrier including a first die paddle of the semiconductor package, and a control transistor having a drain attached to the first die paddle. The semiconductor package also includes a second conductive carrier attached to the first conductive carrier and including a second die paddle of the semiconductor package, and a sync transistor having a drain attached to the second die paddle. The second die paddle couples a source of the control transistor to the drain of the sync transistor.

18 Claims, 6 Drawing Sheets

US 9,564,389 B2

SEMICONDUCTOR PACKAGE WITH INTEGRATED DIE PADDLES FOR POWER STAGE

The present application claims the benefit of and priority to a provisional application entitled "Dual Gauge Conductive Carrier Package for a Power Switching Stage," Ser. No. 61/954,721, filed on Mar. 18, 2014. The disclosure in this provisional application is hereby incorporated fully by reference into the present application.

BACKGROUND

Background Art

Voltage converters are used in a variety of electronic circuits and systems. Semiconductor packaging solutions for such voltage converters must typically be configured to accommodate power transistors, sometimes referred to as control and sync transistors, as well as the high current switch node connection between the control and sync transistors. In conventional voltage converter packages, the switch node connection between the control and sync transistors is typically implemented using a conductive clip, such as a copper clip, which must be sufficiently robust to accommodate high current. Because the control and sync transistors can be highly sensitive to electrical resistance, the cross-sectional area of the conductive clip used to provide the switch node connection may have to be relatively large.

Moreover, the control and sync transistors are capable of generating substantial heat during operation. In many conventional implementations, that potentially damaging heat necessitates use of a dedicated heat spreader, which is also often relatively large. Consequently, conventional voltage converter packages must typically be sized to accommodate not only the control and sync transistors, but a large heat spreader providing thermal protection for those power transistors, and a large conductive clip for their connection, as well.

SUMMARY

The present disclosure is directed to a semiconductor package with integrated die paddles for power stage, substantially as shown in and/or described in connection with at least one of the figures, and as set forth more completely in the claims.

DETAILED DESCRIPTION

Figure 1:
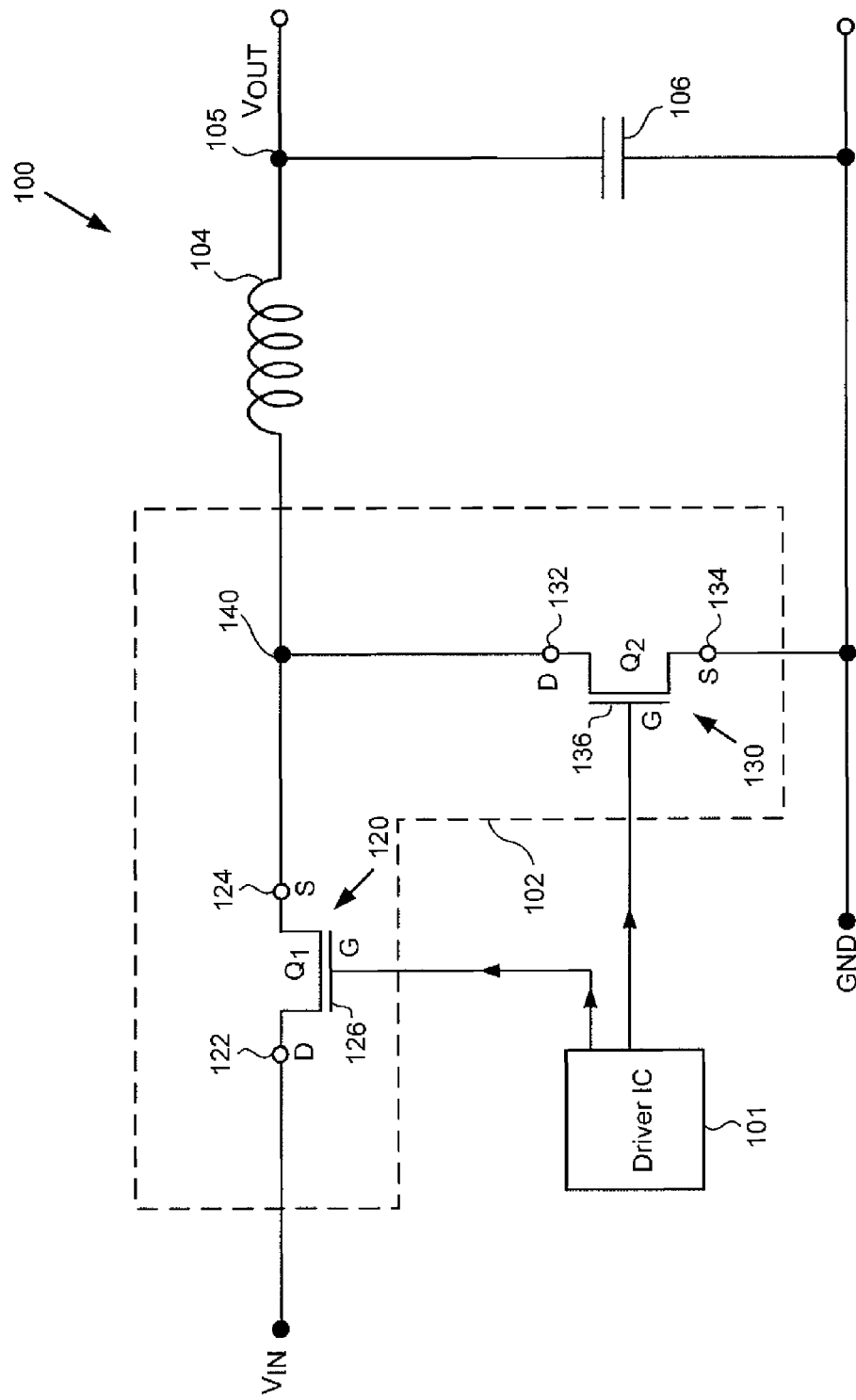
FIG. 1 shows a diagram of an exemplary circuit suitable for use as a voltage converter.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power converters, such as voltage regulators, are used in a variety of electronic circuits and systems. For instance, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 shows a diagram of an exemplary power converter circuit suitable for use as a voltage converter. Voltage converter 100 includes driver IC 101, power stage multichip module (MCM) 102, output inductor 104, and output capacitor 106. As shown in FIG. 1, power stage MCM 102 includes high side and low side power switches of voltage converter 100, and driver IC 101 is implemented to provide drive signals to those high side and low side power switches. As shown in FIG. 1, voltage converter 100 is configured to receive an input voltage $V_{IN}$, and to provide a converted voltage, e.g., a rectified and/or stepped down voltage, as $V_{OUT}$ at output 105.

Power stage MCM 102 may be implemented using two power switches in the form of metal-oxide-semiconductor field-effect transistors (MOSFETs) configured as a half-bridge, for example. That is to say, power stage MCM 102 may include high side or control transistor 120 ($Q_1$) having drain 122, source 124, and gate 126, as well as low side or sync transistor 130 ($Q_2$) having drain 132, source 134, and gate 136. Control transistor 120 is coupled to sync transistor 130 at switch node 140, which, in turn, is coupled to output 105 through output inductor 104. Respective control and sync transistors 120 and 130 may be implemented as group IV based power transistors, such as silicon power MOSFETs having a vertical design, for example. Voltage converter 100 may be advantageously utilized, for example as a buck converter, in a variety of automotive, industrial, appliance, and lighting applications.

It is noted that in the interests of ease and conciseness of description, the present inventive principles will in some instances be described by reference to specific implementations of a buck converter including one or more silicon based power transistors. However, it is emphasized that such implementations are merely exemplary, and the inventive principles disclosed herein are broadly applicable to a wide range of applications, including buck and boost converters, implemented using other group IV material based, or group III-V semiconductor based, power transistors. For example, control and sync transistors 120 and 130 may be implemented as any type of silicon or other group IV FET, such as but not limited to MOSFETs and metal-insulator-semiconductor FETs (MISFETs), for instance. Moreover, control and sync transistors 120 and 130 may be implemented as any type of GaN (Gallium Nitride) or other group III-V transistor, such as but not limited to heterostructure FETs (HFETs) or high electron mobility transistors (HEMTs), for example.

It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

As noted above, power transistors such as control and sync transistors 120 and 130 are capable of generating substantial heat during operation. In many conventional implementations, that potentially damaging heat can be diverted away from control and sync transistors 120 and 130 using a dedicated heat spreader, which is often relatively large. In addition, the connection between control transistor 120 and sync transistor 130 providing switch node 140 is typically implemented using a conductive clip, such as a copper clip, which must be sufficiently robust to accommodate high current. Moreover, because control transistor 120 and sync transistor 130 can be highly sensitive to electrical resistance, the cross-sectional area of the conductive clip used to provide switch node 140 may also be relatively large. Consequently, packaging solutions for power stage MCM 102 must typically be sized to accommodate not only control and sync transistors 120 and 130, but a large heat spreader providing thermal protection for those power transistors, and a large conductive clip for their connection, as well.

Figure 2:
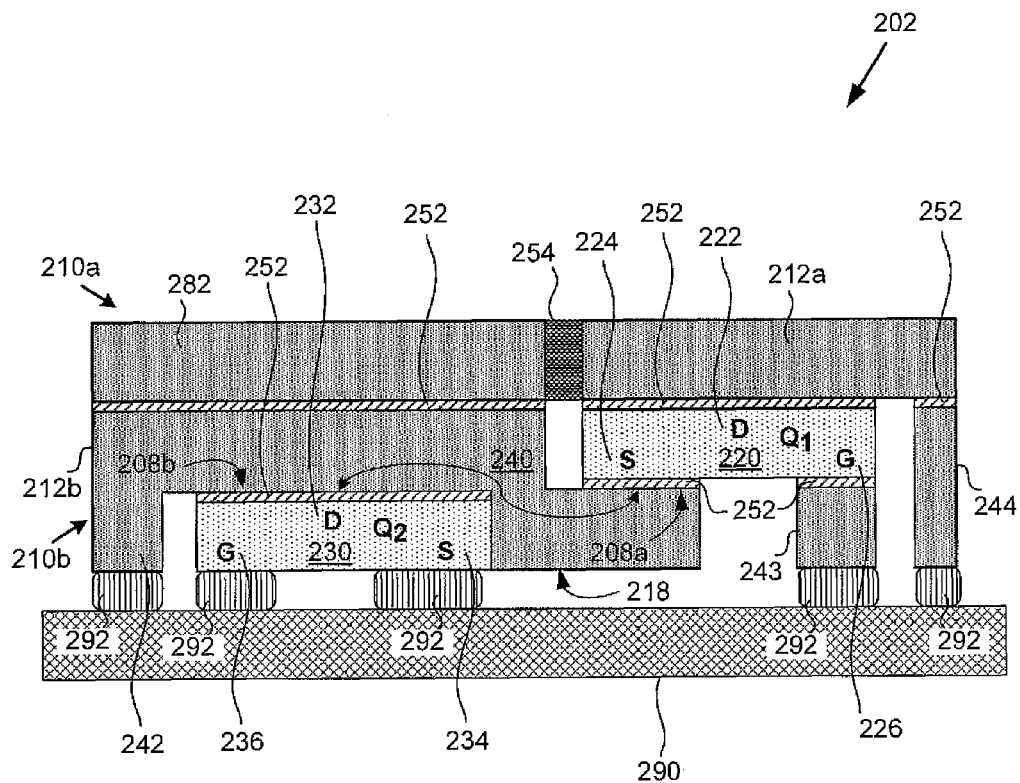
FIG. 2 shows an exemplary representation of a packaging solution according to one implementation of the present disclosure.

The present application discloses a packaging solution enabling omission of the aforementioned heat spreader and switch node conductive clip while concurrently providing thermal protection for control and sync transistors 120 and 130, and also providing a reliable, low resistance, and substantially parasitic free electrical connection for establishing switch node 140. In one implementation, power stage MCM 102 is contained by a dual gauge conductive carrier package configured to provide integrated heat spreading. In addition, one of the conductive carriers used to produce the dual gauge conductive carrier package can also be used to provide switch node 140. It is noted that, as used in the present application, the phrase "dual gauge conductive carrier" refers to a structure assembled from two conductive carriers, such as semiconductor package lead frames, for example. FIG. 2 shows an exemplary representation of a dual gauge conductive carrier packaging solution suitable for packaging a power switching stage.

FIG. 2 shows a cross-sectional view of semiconductor package 202 attached to mounting surface 290, which may be a printed circuit board (PCB) for example, by solder bodies 292. Semiconductor package 202 includes first conductive carrier 210a and second conductive carrier 210b. As shown in FIG. 2, first conductive carrier 210a includes first integrated die paddle 212a and carrier segment 282 that is attached to second conductive carrier 210b. As further shown in FIG. 2, second conductive carrier 210b includes second integrated die paddle 212b, additional second conductive carrier sections 243 and 244, first recessed surface 208a, second recessed surface 208b, and input/output (I/O) surface 218 for connecting semiconductor package 202 to mounting surface 290.

Semiconductor package 202 further includes control transistor 220 ($Q_1$) having drain 222, source 224, and gate 226, as well as sync transistor 230 ($Q_2$) having drain 232, source 234, and gate 236. As shown in FIG. 2, drain 222 of control transistor 220 is attached to first die paddle 212a of first conductive carrier 210a, while source 224 and gate 226 of control transistor 220 are attached to first recessed surface 208a of respective second die paddle 212b and section 243 of second conductive carrier 210b. In addition, drain 232 of sync transistor 230 is attached to second recessed surface 208b on second die paddle 212b of second conductive carrier 210b, while source 234 and gate 236 of sync transistor 230 may be exposed for connection to mounting surface 290, for example by solder bodies 292.

As further shown in FIG. 2, semiconductor package 202 includes electrically and thermally conductive attach material 252, such as an electrically and thermally conductive die attach material or other adhesive, attaching second conductive carrier 210b to first conductive carrier 210a. Also shown in FIG. 2 is semiconductor package molding compound 254.

Semiconductor package 202 also includes switch node contact 242 provided by second die paddle 212b of second conductive carrier 210b. It is noted that in addition to providing switch node contact 242, second die paddle 212b is configured to provide switch node 240 by coupling source 224 of control transistor 220 to drain 232 of sync transistor 230. It is further noted that second die paddle 212b is also configured to sink heat produced by source 224 of control transistor 220 and drain 232 of sync transistor 230 into mounting surface 290. That is to say, second die paddle 212b is configured to serve as an integrated heat spreader of semiconductor package 202. Moreover, in addition to providing a drain contact for control transistor 220, first die paddle 212a of first conductive carrier 210a and section 244 of second conductive carrier 210b are configured to connect drain 222 of control transistor 220 to mounting surface 290 and to sink heat produced by drain 222 into mounting surface 290.

Semiconductor package 202 corresponds in general to power stage MCM 102 in FIG. 1. In addition, control transistor 220 having drain 222, source 224, and gate 226, and sync transistor 230 having drain 232, source 234, and gate 236, correspond in general to control transistor 120 having drain 122, source 124, and gate 126, and sync transistor 130 having drain 132, source 134, and gate 136, respectively, in FIG. 1. Moreover, switch node 240, in FIG. 2, corresponds to switch node 140, in FIG. 1.

It is noted, in reference to FIG. 2, that the electrical connection between source 224 of control transistor 220 and drain 232 of sync transistor 230 is established in the absence of a conductive clip or other feature implemented solely as an electrical connector. Instead, according to the implementation shown in FIG. 2, the electrical connection between source 224 and drain 232 establishing switch node 240, as well as switch node contact 242, are advantageously provided by second die paddle 212b of second conductive carrier 210b. As a result, the packaging solution of FIG. 2 provides a robust, low resistance, and low parasitic connection for providing switch node 240 and switch node contact 242. Moreover, the inventive concepts disclosed by the packaging solution represented in FIG. 2 can be extended to enable the fabrication of high density MCM packages, with reduced parasitics and improved thermal performance.

Figure 3:
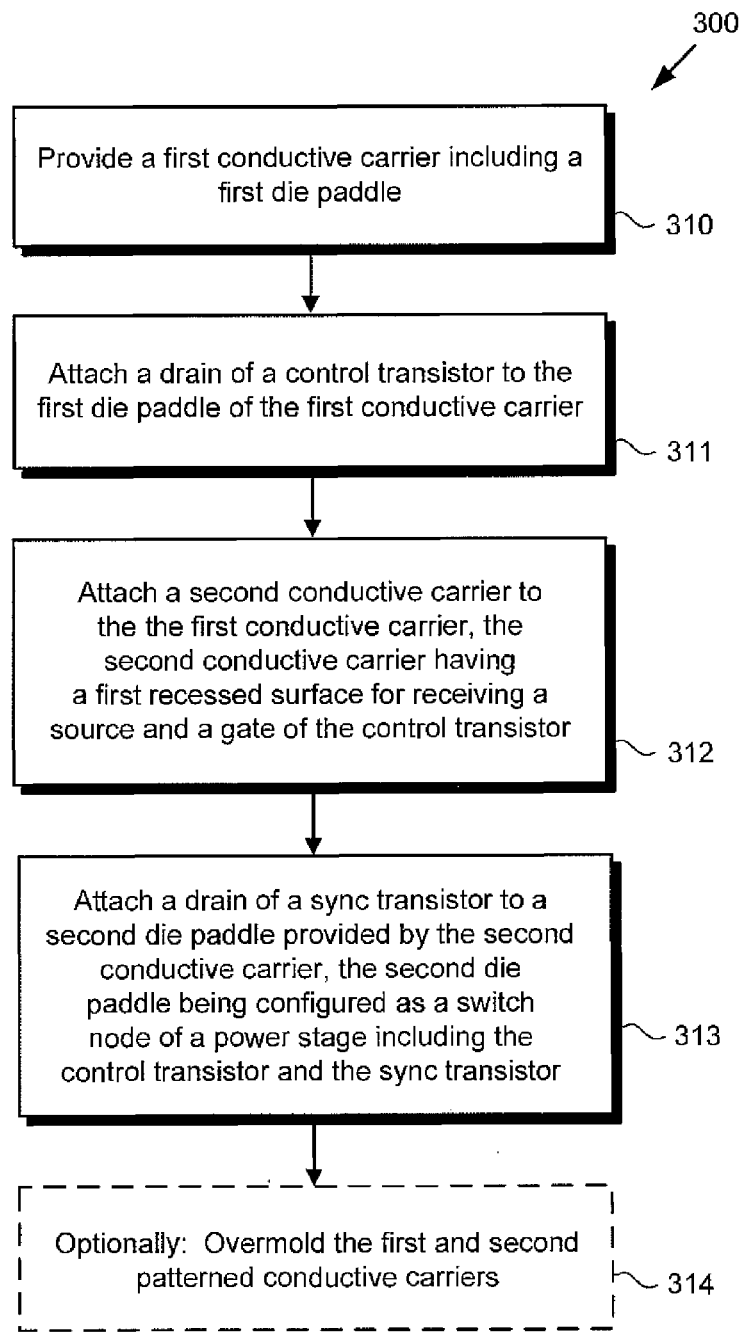
FIG. 3 shows a flowchart presenting an exemplary method for fabricating a semiconductor package according to one implementation of the present disclosure.

The features of semiconductor package 202 will be described in greater detail by reference to FIG. 3, and FIGS. 4A, 4B, 4C, and 4D (hereinafter "FIGS. 4A-4D"). Referring to FIG. 3, FIG. 3 shows flowchart 300 presenting an exemplary method for fabricating a dual gauge conductive carrier package suitable for packaging a power switching stage. It is noted that the method described by flowchart 300 is performed using portions of two conductive carrier structures, which may be semiconductor package lead frames, or may take the form of conductive sheets or plates, for example.

Figure 4A:
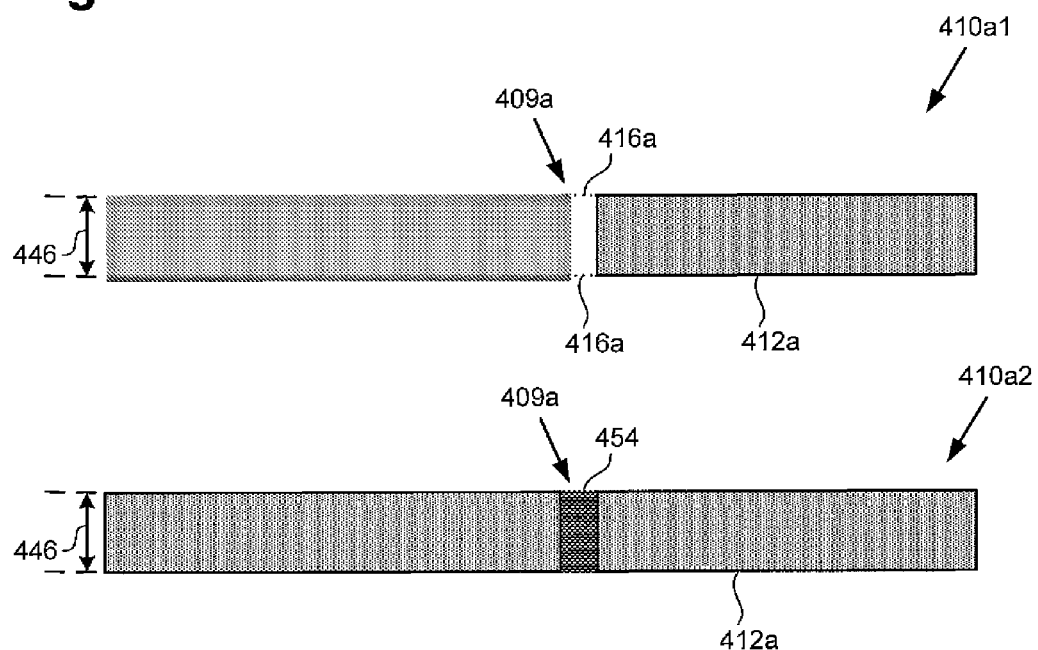
FIG. 4A illustrates a result of performing of an initial action according to the flowchart of FIG. 3 in accordance with one implementation of the present disclosure.

With respect to FIGS. 4A-4D, structures 410 through 413 shown respectively in those figures illustrate the result of performing the method of flowchart 300 using two patterned conductive carriers. For example, FIG. 4A represents first conductive carrier 410a as a patterned conductive carrier including first die paddle 412a in two alternate implementations, i.e., first conductive carriers 410a1 and 410a2 (310). Structure 411 shows first conductive carrier 410a2 after attachment of a control transistor drain to first die paddle 412a (action 311), structure 412 shows structure 411 after attachment of second conductive carrier 410b (action 312), and so forth. It is noted that first conductive carrier 410a1/410a2 and second conductive carrier 410b correspond respectively to first conductive carrier 210a and second conductive carrier 210b, in FIG. 2.

Referring to flowchart 300, in FIG. 3, in combination with FIG. 4A, flowchart 300 begins with providing first conductive carrier 410a1 or 410a2 including first die paddle 412a (action 310). As shown in FIG. 4A, first conductive carrier 410a1 is represented as a pre-patterned conductive sheet or plate having thickness 446 and pre-patterned gap 409a extending through the entirety of thickness 446, i.e., extending entirely through first conductive carrier 410a1.

It is noted that first die paddle 412a is shown as connected to the remainder of first conductive carrier 410a1 by dashed lines 416a to indicate that gap 409a may be visible in FIG. 4A due to the cross-sectional perspective viewed in that figure, but does not extend through first conductive carrier 410a1 in a direction perpendicular to the plane of the page of FIG. 4A. Thus first conductive carrier 410a1 may be provided by a single, substantially continuous, conductive carrier support structure, fully patterned to provide first die paddle 412a.

Referring to first conductive carrier 412a2, it is noted that in some implementations, it may be advantageous or desirable to utilize a conductive carrier that has been pre-molded, as well as pre-patterned. According to the implementation depicted by first conductive carrier 412a2, first conductive carrier 412a2, which is also shown to have thickness 446, has been fully pre-patterned to form gap 409a, and has then been pre-molded such that gap 409a is substantially filled by molding compound 454. Use of a pre-patterned and pre-molded first conductive carrier 412a2 results in first conductive carrier 41a2 having greater mechanical strength compared to first conductive carrier 412a1, while providing additional electrical and thermal isolation for first die pad 412a.

First conductive carrier 410a1/410a2 may be formed of any conductive material having a suitably low electrical resistance. Examples of materials from which first conductive carrier 410a1/410a2 may be formed include copper (Cu), aluminum (Al), or a conductive alloy. In one implementation, as noted above, first conductive carrier 410a1/410a2 may be implemented using a single semiconductor package lead frame. In some implementations, it may be advantageous or desirable to reduce package size by implementing first conductive carrier 410a1/410a2 as a reduced thickness conductive carrier. In other words, thickness 446 may be a reduced thickness. For example, where first conductive carrier 410a1/410a2 is implemented using a semiconductor package lead frame, that lead frame may be a partially etched leadframe, such as a half-etched lead frame, having reduced thickness 446 of approximately one half the thickness of a non-etched lead frame.

Figure 4B:
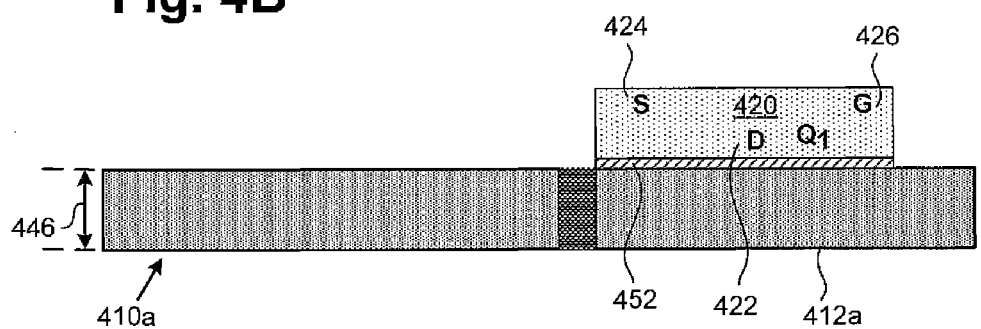
FIG. 4B illustrates a result of performing of a subsequent action according to the flowchart of FIG. 3 in accordance with one implementation of the present disclosure.
Figure 4C:
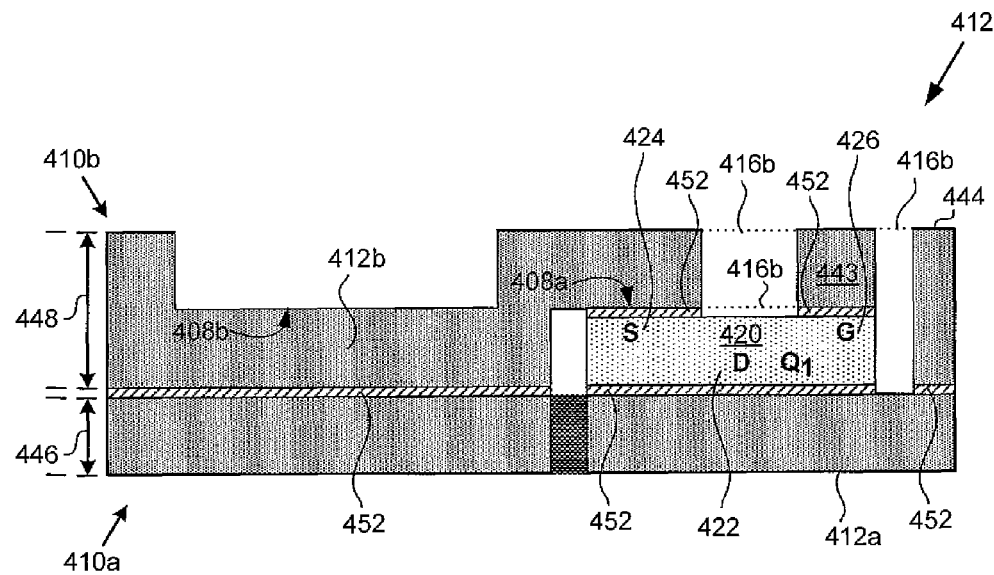
FIG. 4C illustrates a result of performing of a subsequent action according to the flowchart of FIG. 3 in accordance with one implementation of the present disclosure.
Figure 4D:
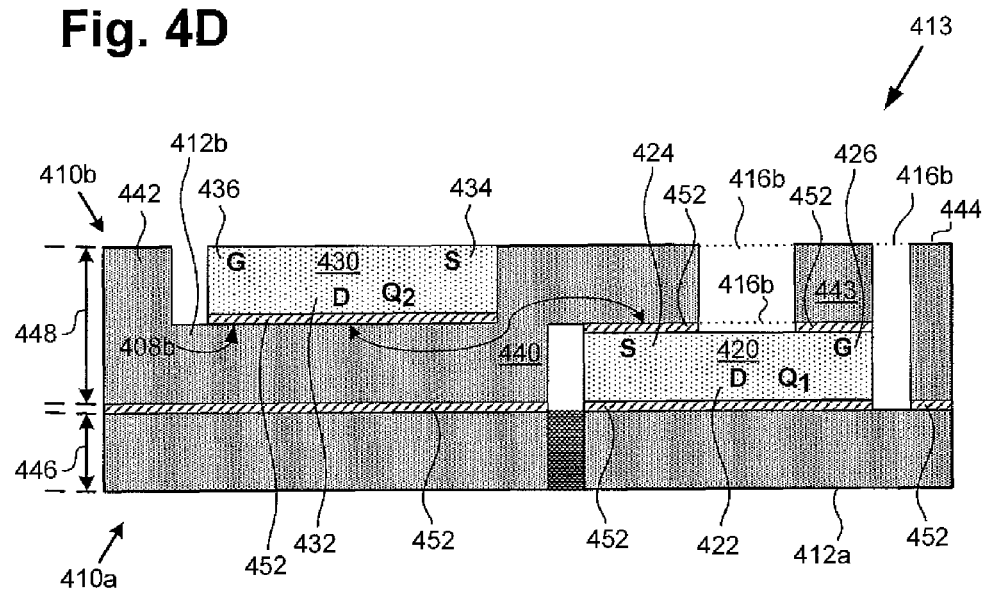
FIG. 4D illustrates a result of performing of a final action according to the flowchart of FIG. 3 in accordance with one implementation of the present disclosure.

Moving to structure 411 in FIG. 4B with ongoing reference to FIG. 3, flowchart 300 continues with attaching drain 422 of control transistor 420 ($Q_1$) to first die paddle 412a of first conductive carrier 410a (action 311). It is noted that FIGS. 4B, 4C, and 4D depict continued use of first conductive carrier 410a2, in FIG. 4A, as conductive carrier 410a. However, it is to be understood that the present method may proceed using either of first conductive carriers 410a1 or 410a2, in FIG. 4A, as first conductive carrier 410a in FIGS. 4B, 4C, and 4D.

Control transistor 420 includes drain 422, source 424, and gate 426. As shown in FIG. 4B, drain 422 of control transistor 420 is attached to first die paddle 412a of first conductive carrier 410a by electrically and thermally conductive attach material 452. Electrically and thermally conductive attach material 452 may be any suitable substance, such as a conductive epoxy, solder, a conductive sintered material, or a diffusion bonded material, formed to a thickness of at least 10 μm, for example. Control transistor 420 is shown as a power transistor having a vertical topology. That is to say, source 424 and gate 426 are situated on the same side of control transistor 420, while drain 422 is situated on an opposite side of control transistor 420. Control transistor 420, and electrically and thermally conductive attach material 452 correspond respectively to control transistor 220, and electrically and thermally conductive attach material 252, in FIG. 2.

As shown by structure 412 in FIG. 4C, flowchart 300 continues with attaching second conductive carrier 410b to first conductive carrier 410a, second conductive carrier 410b having first recessed surface 408a for receiving source 424 and gate 426 of control transistor 420 (action 312). Second conductive carrier 410b has thickness 448 and includes second die paddle 412b and second conductive carrier section 443 having first recessed surface 408a, second recessed surface 408b of second die paddle 4126b, and second conductive carrier section 444. Second conductive carrier 410b is attached to first conductive carrier 410a, and to source 424 and gate 426 of control transistor 420 by electrically and thermally conductive material 452, described above.

It is noted that second die paddle 412b is shown as connected to additional second conductive carrier sections 443 and 444 by dashed lines 416b to indicate that the gaps visible in FIG. 4C due to the cross-sectional perspective viewed in that figure do not extend through second conductive carrier 410b in a direction perpendicular to the plane of the page of FIG. 4C. Thus second conductive carrier 410b may be provided by a single, substantially continuous, conductive carrier support structure, fully patterned to provide second die paddle 412b.

Second conductive carrier 410b may be formed of any conductive material having a suitably low electrical resistance, such as Cu, Al, or a conductive alloy. In one implementation, as noted above, second conductive carrier 410b may be implemented using a single semiconductor package lead frame. In those implementations, first recessed surface 408a may be produced by performing a partial etch, such as a half-etch, on a first side, i.e., one of a bottom or a top side, of the lead frame, while second recessed surface 408*b* may be produced by performing a partial etch, such as a half-etch, on a second side opposite the first side. Second conductive carrier 410*b* including die paddle 412*b* having first and second recessed surfaces 408*a* and 408*b*, and additional second conductive carrier sections 443 and 444 corresponds to second conductive carrier 210*b* including second die paddle 212*b* having first and second recessed surfaces 208*a* and 208*b*, and additional second conductive carrier sections 243 and 244, in FIG. 2.

Referring to structure 413 in FIG. 4D, flowchart 300 continues with attaching drain 432 of sync transistor 430 to second die paddle 412*b* of second conductive carrier 410*b* (action 313). As shown in FIG. 4D, drain 432 of control transistor 430 is attached to second die paddle 412*b* by electrically and thermally conductive attach material 452. As further shown in FIG. 4D, sync transistor 430 also includes source 434 and gate 436 on an opposite side of sync transistor 430 from drain 432. Sync transistor 430 having source 434, gate 436, and drain 432 attached to second die paddle 412*b* by electrically and thermally conductive attach material 452 corresponds to sync transistor 230 having source 234, gate 236, and drain 232 attached to second die paddle 212*b* by electrically and thermally conductive attach material 252, in FIG. 2.

By attaching second die paddle 412*b* to source 424 of control transistor 420 using electrically and thermally conductive attach material 452, and attaching drain 432 of sync transistor 430 to second die paddle 412*b* using electrically and thermally conductive attach material 452, the present method utilizes second die paddle 412*b* to couple source 424 to drain 432. As a result, second die paddle 412*b* is configured to serve as switch node 440 of the power stage including control transistor 420 and sync transistor 430. In addition, second die paddle 412*b* provides switch node contact 442 for external connection of switch node 440 to a PCB or other mounting surface, for example. Switch node 440 and switch node contact 442 correspond respectively to switch node 240 and switch node contact 242, in FIG. 2.

In some implementations, structure 413 in FIG. 4D may be inverted and attached to a mounting surface to produce a semiconductor package corresponding to semiconductor package 202, in FIG. 2. However, in implementations in which first conductive carrier 410*a*1, in FIG. 4A, is used as first conductive carrier 410*a*, it may be advantageous or desirable to overmold first and second conductive carriers 410*a* and 410*b* (action 314). The result of such an optional processing step is shown in FIG. 5.

Figure 5:
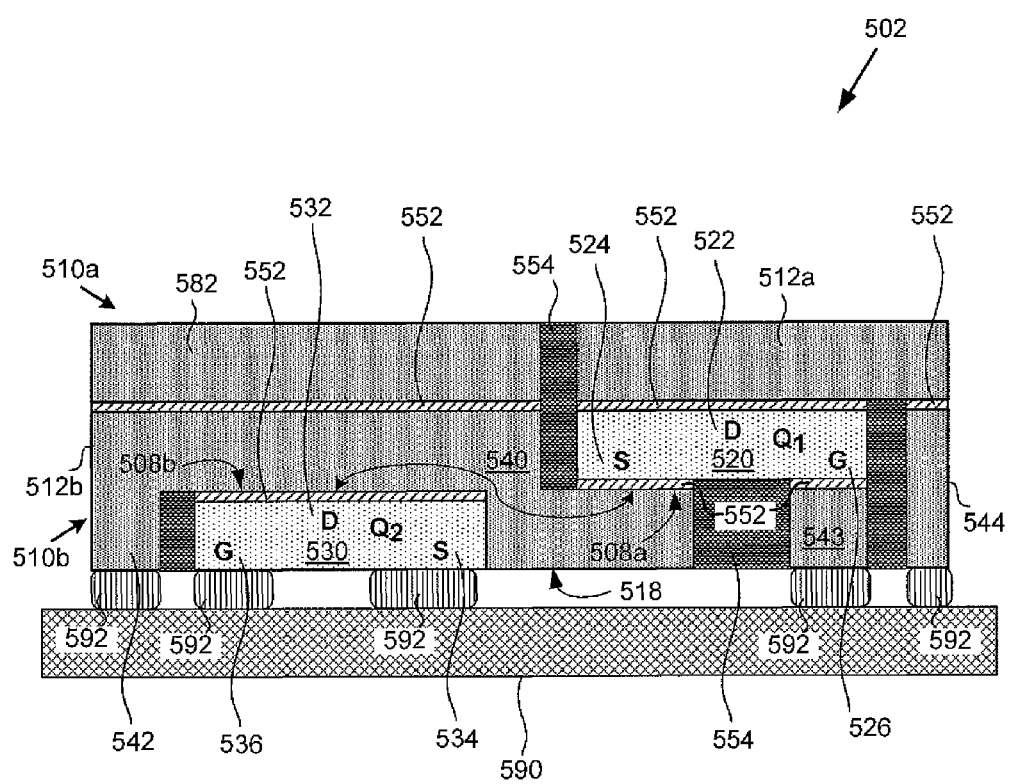
FIG. 5 shows an exemplary representation of a packaging solution according to another implementation of the present disclosure.

FIG. 5 shows a cross-sectional view of semiconductor package 502 attached to mounting surface 590, which may be a PCB for example, by solder bodies 592. Semiconductor package 502 includes first conductive carrier 510*a* and second conductive carrier 510*b*. As shown in FIG. 5, first conductive carrier 510*a* includes first die paddle 512*a* and carrier segment 582 that is attached to second conductive carrier 510*b*. As further shown in FIG. 2, second conductive carrier 510*b* includes second die paddle 512*b*, additional second conductive carrier sections 543 and 544, first recessed surface 508*a*, second recessed surface 508*b*, and I/O surface 518 for connecting semiconductor package 502 to mounting surface 590.

Semiconductor package 502 further includes control transistor 520 ($Q_1$) having drain 522, source 524, and gate 526, as well as sync transistor 530 ($Q_2$) having drain 532, source 534, and gate 536. As shown in FIG. 5, drain 522 of control transistor 520 is attached to first die paddle 512*a* of first conductive carrier 510*a*, while source 524 and gate 526 of control transistor 520 are attached to first recessed surface 508*a* of second conductive carrier 510*b*. In addition, drain 532 of sync transistor 530 is attached to second recessed surface 508*b* on second die paddle 512*b* of second conductive carrier 510*b*, while source 534 and gate 536 of sync transistor 530 may be exposed for connection to mounting surface 590, for example by solder bodies 592. As further shown in FIG. 5, semiconductor package 502 includes electrically and thermally conductive attach material 552, such as an electrically and thermally conductive die attach material or other adhesive, and semiconductor package molding compound 554.

Also included as part of semiconductor package 502 is switch node contact 542 provided by second die paddle 512*b* of second conductive carrier 510*b*. It is noted that in addition to providing switch node contact 542, second die paddle 512*b* is configured to provide switch node 540 by coupling source 524 of control transistor 520 to drain 532 of sync transistor 530. It is further noted that second die paddle 512*b* is also configured to sink heat produced by source 524 of control transistor 520 and drain 532 of sync transistor 530 into mounting surface 590. That is to say, second die paddle 512*b* is configured to serve as an integrated heat spreader of semiconductor package 502. Moreover, in addition to providing a drain contact for control transistor 520, first die paddle 512*a* of first conductive carrier 510*a* and section 544 of second conductive carrier 512*b* are configured to connect drain 522 of control transistor 520 to mounting surface 590 and to sink heat produced by drain 522 into mounting surface 590.

As shown in FIG. 5, semiconductor package 502 has been overmolded using molding compound 554, which may be any molding compound typically used in semiconductor packaging, as known in the art. Consequently, substantially all gaps in semiconductor package 502 may be filled by molding compound 554, resulting in a mechanically robust semiconductor package providing enhanced electrical isolation for control and sync transistors 520 and 530.

Semiconductor package 502 corresponds in general to power stage MCM 102 in FIG. 1. In addition, control transistor 520 having drain 522, source 524, and gate 526, and sync transistor 530 having drain 532, source 534, and gate 536, correspond in general to control transistor 120 having drain 122, source 124, and gate 126, and sync transistor 130 having drain 132, source 134, and gate 136, respectively, in FIG. 1. Moreover, switch node 540, in FIG. 5, corresponds to switch node 140, in FIG. 1.

Thus, utilizing a portion of a dual gauge conductive carrier package as a switch node connection capable of providing integrated heat spreading enables a highly compact semiconductor package design, while concurrently providing thermal protection. Furthermore, use of such a portion of a dual gauge conductive carrier package to provide a switch node connection advantageously enables omission of a conventional conductive clip from the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
   a first conductive carrier including a first die paddle of said semiconductor package;
   a control transistor having a drain attached to said first die paddle;
   a second conductive carrier attached to said first conductive carrier and including a second die paddle of said semiconductor package;
   a sync transistor having a drain attached to said second die paddle;
   said second die paddle being further attached to a source of said control transistor so as to couple said source of said control transistor to said drain of said sync transistor.

2. The semiconductor package of claim 1, wherein said second die paddle is configured as an integrated head spreader for said semiconductor package.

3. The semiconductor package of claim 1, wherein said control transistor and said sync transistor form a power switching stage of a voltage converter.

4. The semiconductor package of claim 1, wherein said first conductive carrier has a reduced thickness.

5. The semiconductor package of claim 1, wherein said first conductive carrier comprises at least a portion of a partially etched lead frame.

6. The semiconductor package of claim 1, wherein said control transistor and said sync transistor comprise silicon field-effect transistors (FETs).

7. The semiconductor package of claim 1, wherein said control transistor and said sync transistor comprise III-Nitride high electron mobility transistors (HEMTs).

8. The semiconductor package of claim 1, wherein said second conductive carrier is configured to connect said first conductive carrier, said control transistor, and said sync transistor to a mounting surface for said semiconductor package.

9. The semiconductor package of claim 3, wherein said second die paddle provides a switch node of said power switching stage.

10. The semiconductor package of claim 5, wherein said partially etched lead frame is substantially half-etched.

11. A semiconductor package comprising:
    a first conductive carrier including a first die paddle;
    a control transistor having a drain attached to said first die paddle;
    a second conductive carrier including a second die paddle attached to a source of said control transistor;
    a sync transistor having a drain attached to said second die paddle.

12. The semiconductor package of claim 11, wherein said second die paddle is configured as an integrated heat spreader for said semiconductor package.

13. The semiconductor package of claim 11, wherein said control transistor and said sync transistor form a power switching stage of a voltage converter.

14. The semiconductor package of claim 11, wherein said first conductive carrier comprises at least a portion of a partially etched lead frame.

15. The semiconductor package of claim 11, wherein said control transistor and said sync transistor comprise silicon field-effect transistors (FETs).

16. The semiconductor package of claim 11, wherein said control transistor and said sync transistor comprise III-Nitride high electron mobility transistors (HEMTs).

17. The semiconductor package of claim 11, wherein said second conductive carrier is configured to connect said first conductive carrier, said control transistor, and said sync transistor to a mounting surface for said semiconductor package.

18. The semiconductor package of claim 14, wherein said partially etched lead frame is substantially half-etched.

* * * * *